United States Patent
Cooper et al.

(10) Patent No.: US 8,265,559 B2
(45) Date of Patent: Sep. 11, 2012

(54) METHOD AND APPARATUS FOR DETERMINING MODULATION LEVELS THAT ARE SUPPORTED ON A CHANNEL

(75) Inventors: Michael J. Cooper, Marietta, GA (US); Charles S. Moore, Langhorne, PA (US); John L. Moran, Uxbridge, MA (US); Brian Thibeault, Attleboro, MA (US); Robert J. Thompson, Monroeton, PA (US)

(73) Assignee: General Instrument Corporation, Horsham, PA (US)

( * ) Notice: Subject to any disclaimer, the term of this patent is extended or adjusted under 35 U.S.C. 154(b) by 1212 days.

(21) Appl. No.: 12/022,249

(22) Filed: Jan. 30, 2008

(65) Prior Publication Data

US 2008/0200129 A1 Aug. 21, 2008

Related U.S. Application Data

(60) Provisional application No. 60/887,166, filed on Jan. 30, 2007.

(51) Int. Cl.
*H04N 7/173* (2006.01)
*H04B 1/00* (2006.01)

(52) U.S. Cl. ......... 455/44; 455/61; 455/102; 455/126; 455/509; 455/515; 455/67.11; 455/67.14; 725/105

(58) Field of Classification Search .......... 455/44, 455/61, 102, 126, 509, 515, 67.11, 67.14; 725/105

See application file for complete search history.

(56) References Cited

U.S. PATENT DOCUMENTS

| | | | |
|---|---|---|---|
| 6,154,503 A | 11/2000 | Strolle | |
| 6,240,553 B1 | 5/2001 | Son et al. | |
| 6,310,909 B1 | 10/2001 | Jones | |
| 6,546,557 B1 | 4/2003 | Ovadia | |
| 6,973,141 B1 | 12/2005 | Isaksen et al. | |
| 7,421,276 B2 * | 9/2008 | Steer et al. | 455/456.1 |
| 2003/0149991 A1 * | 8/2003 | Reidhead et al. | 725/119 |
| 2004/0073937 A1 * | 4/2004 | Williams | 725/107 |
| 2004/0248520 A1 * | 12/2004 | Miyoshi | 455/67.13 |
| 2005/0039103 A1 * | 2/2005 | Azenko et al. | 714/776 |
| 2005/0064890 A1 * | 3/2005 | Johan et al. | 455/522 |
| 2005/0226161 A1 * | 10/2005 | Jaworski | 370/241 |
| 2007/0184835 A1 * | 8/2007 | Bitran et al. | 455/434 |
| 2008/0274700 A1 * | 11/2008 | Li | 455/67.11 |

OTHER PUBLICATIONS

PCT International Search Report & Written Opinion. Issued for PCT/US08/52436. Dated May 22, 2008.

* cited by examiner

*Primary Examiner* — Wen Huang
(74) *Attorney, Agent, or Firm* — Lori Anne D. Swanson

(57) ABSTRACT

A logical channel is configured to match a modulation profile of an active channel. A network element is assigned to the logical channel and a ping request is sent to the network element. A response from the network element is measured, such as measuring the MER. The modulation profile is increased in the logical channel and another ping request is sent to the network element. The response is measured again, and the process is repeated until a non-linearity is detected in the response. The acceptable modulation profiles are indicated before the non-linearity is detected in the response.

16 Claims, 4 Drawing Sheets

METHOD AND APPARATUS FOR DETERMINING MODULATION LEVELS THAT ARE SUPPORTED ON A CHANNEL

This application claims the benefit of U.S. Provisional application 60/887,166 filed on Jan. 30, 2007, titled Method To Predict Communications Channel Suitability For Higher Order Modulations, herein incorporated by reference in its entirety.

FIELD OF THE INVENTION

This disclosure is directed toward to predicting channel characteristics usable by network elements on a network. More specifically, the disclosure is directed toward determining modulation levels that are supported on an active channel while not impacting existing data services.

BACKGROUND OF THE INVENTION

Coaxial cable television systems have been in widespread use for many years and extensive networks have been developed. The extensive and complex networks are often difficult for a cable operator to manage and monitor. A typical cable network generally contains a headend which is usually connected to several nodes which provide content to a cable modem termination system (CMTS) containing several receivers, each receiver connects to several network elements of many subscribers, e.g., a single receiver may be connected to hundreds of network elements. In many instances several nodes may serve a particular area of a town or city. The network elements communicate to the CMTS via upstream communications on a dedicated band of frequency.

Cable networks are also increasingly carrying signals which require a high quality and reliability of service, such as voice communications or Voice over IP (VoIP) communications. Any disruption of voice or data traffic is a great inconvenience and often unacceptable to a subscriber. Various factors may affect the quality of service, including the quality of the upstream channels. Cable networks use various management techniques to control their networks, including return path spectrum management techniques. Return path spectrum management generally allows a cable network operator to reassign network elements to different communication parameters or different communication devices, e.g. receivers, to optimize use of the bandwidth spectrum available under certain conditions.

Traditional return-path spectrum management techniques in the cable industry generally revolve around three classical approaches: 1) fast Fourier transform (FFT) or traditional return-path noise power measurements, 2) Packet or Bit error rate tests, and 3) hop-and-hope or trial and error approaches. Clearly the third approach is a poor solution. The second approach requires longer measurement times due to the long period required to collect a statically significant numbers of packets/bits on which to base a metric and in addition, is subject to the random nature of which network elements are sending data (for example, poor performers might bias the results). In addition, the second approach requires the network to make errors prior to triggering network changes. For applications which require error-free or near error-free communications, this is an unacceptable approach. The first approach is solely based upon noise power measurements and requires that the channel be deactivated while the actual noise power measurement is made. A better approach is one which does not impact active data services, considers both noise and distortion affects, and indicates when signal quality is marginal but not yet making actual errors. The modulation error ratio (MER) is often considered the perfect measurement. However, MER for a single channel can vary a great deal (4 to 12 dB) depending upon which cable modem (network element) is selected for the measurement. Further, transient conditions can impact single measurements and must be understood in order to make accurate spectrum management decisions.

Previous techniques which focus on packet/bit error rates or traditional power based Modulation Error Ratio (MER) measurements generally use a composite (average) MER to evaluate the currently active channel and base modulation agility decisions. This approach, however, contains two significant weaknesses: 1) the composite MER reflects the "currently active" cable network elements as measured by data being passed on the upstream, and 2) the composite MER is an average which means that (generally) half the network elements are exhibiting MERs which are lower while many are exhibiting MERs which are higher.

Depending upon what the variance of MER is across the network element population, the range of actual MER performance of the network element population may be wide or narrow. When utilizing the average MER to monitor modulation changes, a narrow distribution of MER values among a plurality of network elements (meaning all network elements are yielding very similar MER readings) are good and allow the network operator to make modulation changes in which all network elements may continue to pass data. However, if the distribution is wide, and the network operator bases the modulation configuration changes on the average, there is a significant risk that some of the network elements (which are operating at MERs much lower than the channel average) will no longer be able to pass data on such a channel. For example, typical plant conditions are expected to yield a spread of between 4 and 12 dB. With 3 dB differences required to support each modulation type (QPSK, 8QAM, 16QAM, 32QAM, 64QAM, 128QAM, 256QAM), this implies that network elements are typically distributed across 2 to 4 different supported modulation types.

Generally, MER is a good predictor of what level of modulation (QPSK, 8QAM, 16QAM, 32QAM, 64QAM, 128QAM, or 256QAM) that a communications channel can support. With most DOCSIS 2.0 CMTS's deployed today, the operator can retrieve each cable modem's or MTA's MER and could therefore generally predict whether the channel could be reconfigured to run a higher modulation and therefore achieve a higher bit rate (throughput) on the channel. The one major exception to the prediction is the impacts of non-linearities (specifically such factors as overstressing the optical link—either laser or optical receiver, and in some remote cases, stressing an RF amplifier). Non-linearities are not reflected necessarily reflected at lower level modulations. Therefore, the user must increase the modulation level while simultaneously monitoring the MER measurement. If a significant change in the MER is experienced as the modulation level is increased, then it may be correctly inferred that a non-linearity is present and higher modulations require further analysis. Thus, the user must perform measurements at higher modulations (risking impacts to data communications) to successfully predict these modulation configuration changes. The user clearly does not want to change the modulations of all his modems/MTAs while providing data services in order to perform this characterization. What is needed is the ability to selectively change the modulation level of a single modem/MTA device without impacting all of the others.

SUMMARY OF THE INVENTION

The disclosure provides an apparatus and process for determining acceptable modulation profiles to communicate with network elements.

In accordance with principles of the invention, an apparatus of the invention may comprise: a microprocessor configured to configure modulation profiles of a communication channel, to select a network element of the plurality of network elements as a test network element, and to send a test signal to the test network element using a configured modulation profile; and a receiver configured to receive a response to the test signal from the test network element, wherein the apparatus determines acceptable modulation profiles which can be used to communicate with the network element using responses to the test signal from the test network element. The acceptable modulation profiles may be determined based on one or more of: signal to noise ratio, modulation error ratio, packet error rate, burst error rate, forward error correction error rates, network element transmit level, or signal distortion ratio. The communication channel may be a logical channel which is configured to have a modulation profile matching that of an active channel of a selected network element. The determination of acceptable modulation profiles preferably does not impact existing network communications.

In accordance with principles of the invention, a method of the invention may comprise the steps of: configuring a logical communication channel with a modulation profile matching an active communication channel for a selected network element; assigning the selected network element to the logical communication channel; sending a communication to the selected network element via the logical communication channel; measuring one or more characteristics of a response received from the selected network element; and determining acceptable modulation profiles which can be used to communicate with the network element based on the one or more characteristics of the response. The one or more characteristics may include one or more of: signal to noise ratio, modulation error ratio, packet error rate, burst error rate, forward error correction error rates, network element transmit level, or signal distortion ratio. The modulation profile of the channel is increased until it is determined that an unacceptable modulation profile has been reached. The modulation profile includes at least one of QPSK, 8QAM, 16QAM, 32QAM, 64QAM, 128QAM, or 256QAM. An unacceptable modulation profile is indicated when a non-linearity is detected in the response received from the network element in one or more of the characteristics.

In accordance with principles of the invention, a computer readable medium carrying instructions for a computer to perform a method of identifying a network element to use for testing a network may comprise the steps of: configuring a logical communication channel with a modulation profile matching an active communication channel for a selected network element; assigning the selected network element to the logical communication channel; sending a communication to the selected network element via the logical communication channel; measuring one or more characteristics of a response received from the selected network element; and determining acceptable modulation profiles which can be used to communicate with the network element based on the one or more characteristics of the response. The one or more characteristics include one or more of: signal to noise ratio, modulation error ratio, packet error rate, burst error rate, forward error correction error rates, network element transmit level, or signal distortion ratio.

BRIEF DESCRIPTION OF THE DRAWINGS

The following drawings serve to illustrate the principles of the invention.

DETAILED DESCRIPTION OF THE INVENTION

The invention allows an operator to determine the modulation levels that are supported by network elements on a network. The invention allows an operator to remotely test a network element's ability to communicate on various modulation levels without significant impairment of a user's communications. For example, a network element's ability to communication using modulation levels such as QPSK to 8QAM, from 8QAM to 16QAM, from 16QAM to 32QAM, from 32QAM to 64QAM, from 64QAM to 128QAM, or from 128QAM to 256QAM may be tested. In the present invention, the operator has preferably deployed active services and is running upstream port configurations with at least one unused logical channel. Notably, DOCSIS 2.0 requires support for 4 logical channels.

In a preferred implementation, the selected network elements are serviced by, or reside on, the same optical node or serving group. A methodology for isolating devices which reside on the same optical node or serving group is provided in a commonly assigned disclosure entitled METHOD AND APPARATUS FOR GROUPING TERMINAL NETWORK DEVICES filed on Sep. 5, 2006 and assigned U.S. Ser. No. 11/470,034, herein incorporated by reference in its entirety.

Figure 1:
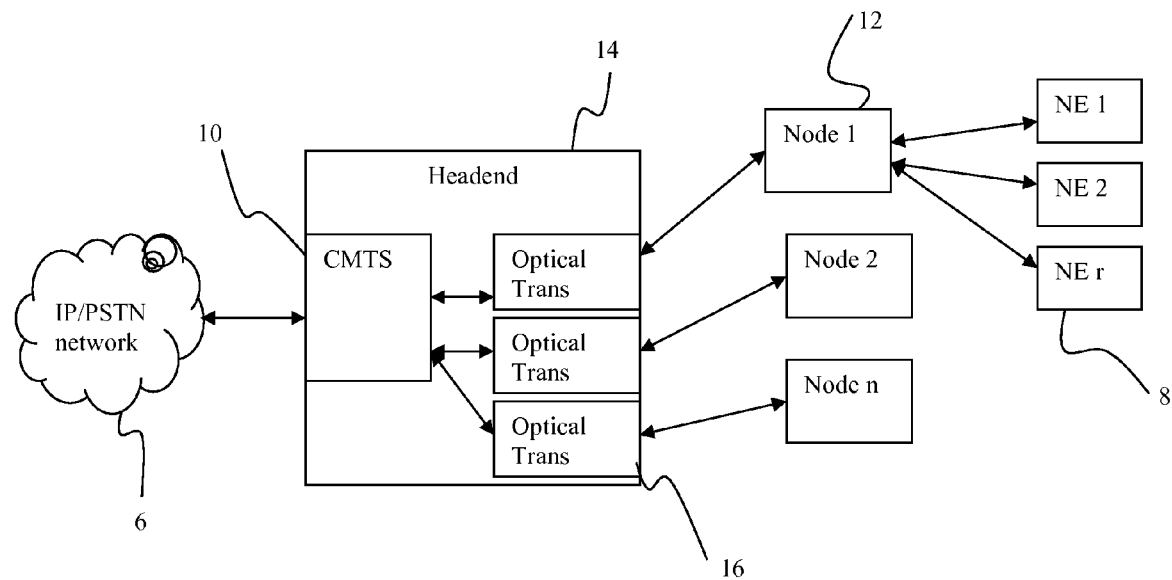
FIG. 1 illustrates an exemplary network in accordance with the principles of the invention.

FIG. 1 illustrates an exemplary network in which a plurality of terminal network elements 8 (e.g. cable modems, set top boxes, televisions equipped with set top boxes, or any other element on a network such as an HFC network) are connected to a cable modem termination system (CMTS) 10 located in a headend 14 through nodes 12 and one or more taps (not shown). In an exemplary arrangement, headend 14 also contains an optical transceiver 16 which provides optical communications through an optical fiber to the plurality of nodes 12. The CMTS 10 connects to an IP or PSTN network 6. Those of skill in the art will appreciate that there may be a plurality of nodes 12 connected to a headend, and a headend may contain a plurality of CMTS 10 units, each of which contain a plurality of receivers (e.g. 8 receivers) each of which communicate with a plurality (e.g. 100 s) of network elements 8. The CMTS 10 may also contain a spare receiver which is not continuously configured to network elements 8, but may be selectively configured to network elements 8. Use of a spare receiver is described in commonly assigned U.S. Ser. No. 11/171,066, filed on Jun. 30, 2005 and titled Automated Monitoring of a Network, herein incorporated by reference in its entirety.

Figure 2:
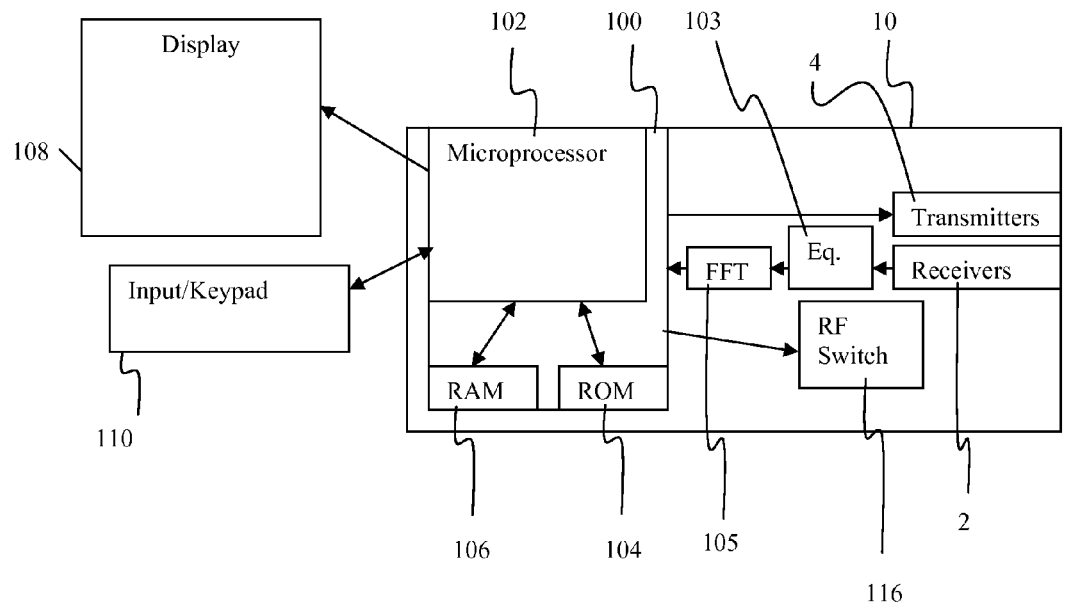
FIG. 2 illustrates a logical architecture of an exemplary CMTS 10 to facilitate an understanding of the invention.

FIG. 2 illustrates a logical architecture of an exemplary CMTS 10 to facilitate an understanding of the invention. As illustrated in FIG. 2, CMTS 10 may contain a processing unit 100 which may access a RAM 106 and a ROM 104, and may control the operation of the CMTS 10 and RF communication signals to be sent by the network elements 8 to the CMTS 10. Processing unit 100 preferably contains a microprocessor 102 which may receive information, such as instructions and data, from a ROM 104 or RAM 106. Processing unit 100 is preferably connected to a display 108, such as a CRT or LCD display, which may display status information such as whether a station maintenance (SM) is being performed or a receiver is in need of load balancing. Those of skill in the art will appreciate that a SM is a type of burst within the DOCSIS standard which maintains a tuned configuration for a network element to allow it to communication with the CMTS. An input keypad 110 may also be connected to processing unit 100 and may allow an operator to provide instructions, processing requests and/or data to processor 100.

RF transceiver (transmitter/receiver) unit preferably contains a plurality of transmitters 4 and receivers 2 to provide bi-directional communication with a plurality of network elements 8 through optical transceivers 16, nodes 12 and a plurality of network taps (not shown). Those of skill in the art will appreciate that CMTS 10 may contain a plurality of RF receivers 2, e.g. 8 RF receivers and a spare RF receiver. Each RF receiver 2 may support over 100 network elements. The RF receiver 2, such as a Broadcom 3140 receiver (receiver), preferably provides the received RF signals to an equalizer 103 which is used to acquire equalizer values and burst modulation error ratio (MER) measurements, packet error rate (PER) and bit error rate (BER). Equalizer 103 is preferably a multiple tap linear equalizer (e.g. a 24 tap linear equalizer), which also may be known as a feed forward equalizer (FFE). Equalizer 103 may be integrally contained in RF receiver 2 or may be a separate device. RF receiver 2 may also include FFT module 105 to support power measurements. The communication characteristics of each receiver 2 may be stored on ROM 104 or RAM 106, or may be provided from an external source, such as headend 14. RAM 104 and/or ROM 106 may also carry instructions for microprocessor 102.

Figure 3:
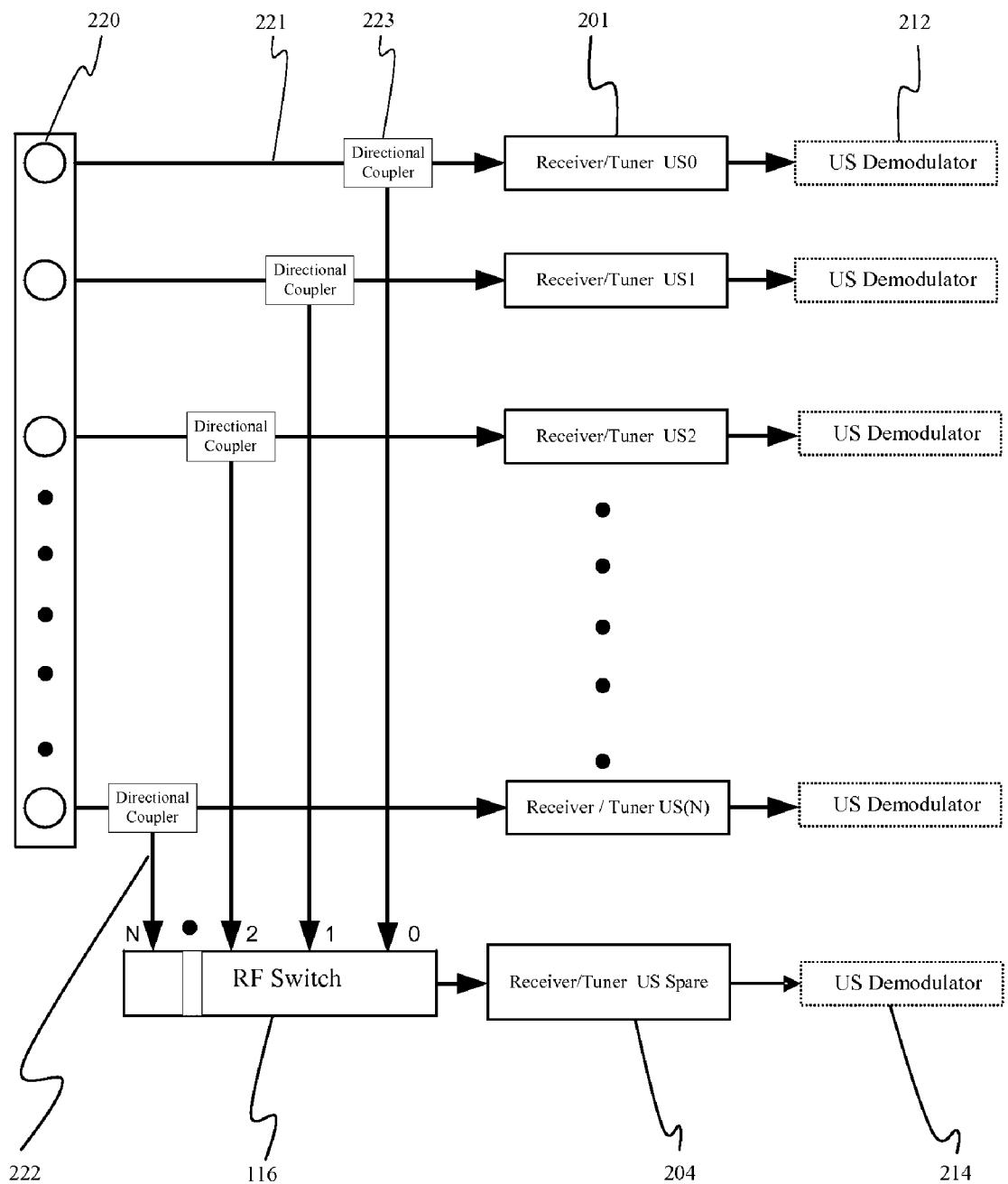
FIG. 3 illustrates a logical arrangement of a group of receivers to facilitate an understanding of the invention.

FIG. 3 illustrates a logical arrangement of a group of receivers 201 to facilitate an understanding of the invention. As illustrated in FIG. 3 a spare receiver 204 may be tapped into each of the primary receiver ports 220 (e.g. R0-R7) in a non-intrusive manner. As illustrated, CMTS receiver ports 220, which may be in the form of Amphenol connectors, are provided to allow cables, e.g. coaxial cables, (not shown) to be connected with primary receivers 201.

Spare receiver 204 preferably taps, via a directional coupler 223, into signal lines 221 of primary receiver ports 220 via signal lines 222, and the taps are preferably located where the cable signal comes from receiver ports 220 into the receivers 201 so both the connected primary receiver 201 and the spare receiver 204 may receive the same signal. Those of skill in the art will appreciate that each of the primary receivers 201 (e.g. receivers R0-R7) receive signals according to different communication characteristics, e.g. communication on a different frequency (RF band) and communication protocols. Spare receiver 204 is preferably tunable to the RF bands of each of the primary receivers 201. Preferably, the spare receiver 204 connects (matrices) with only one primary receiver 201 at a time.

When a cable operator initiates a testing operation they may select any registered network element of their choice or the CMTS 10 may select the network element for them. Once the network element has been selected it is moved (tuned to the frequency) to the spare receiver testing data is passed to it and the results are measured. Once the testing measurements are completed the network element is moved back (instructed to retune to frequency of the primary receiver) to its original primary receiver. This whole process is preferably performed without deregistering the network element from the network to avoid disrupting the subscriber's service or any other services on the primary receiver to other subscribers.

The test signals may be implemented using one of the available upstream DOCSIS bandwidths, e.g. 200 kHz, 400 kHz, 800 kHz, 1600 kHz, 3200 kHz or 6400 kHz. A preferred implementation may use the narrow 800 kHz bandwidth at the upper band edge where diplexer rolloff is significant since narrow bandwidths minimize the amount of clean spectrum required within the return path, and wider bandwidths are used where available spectrum permits in order to gain improved resolution in the measurements.

Figure 4:
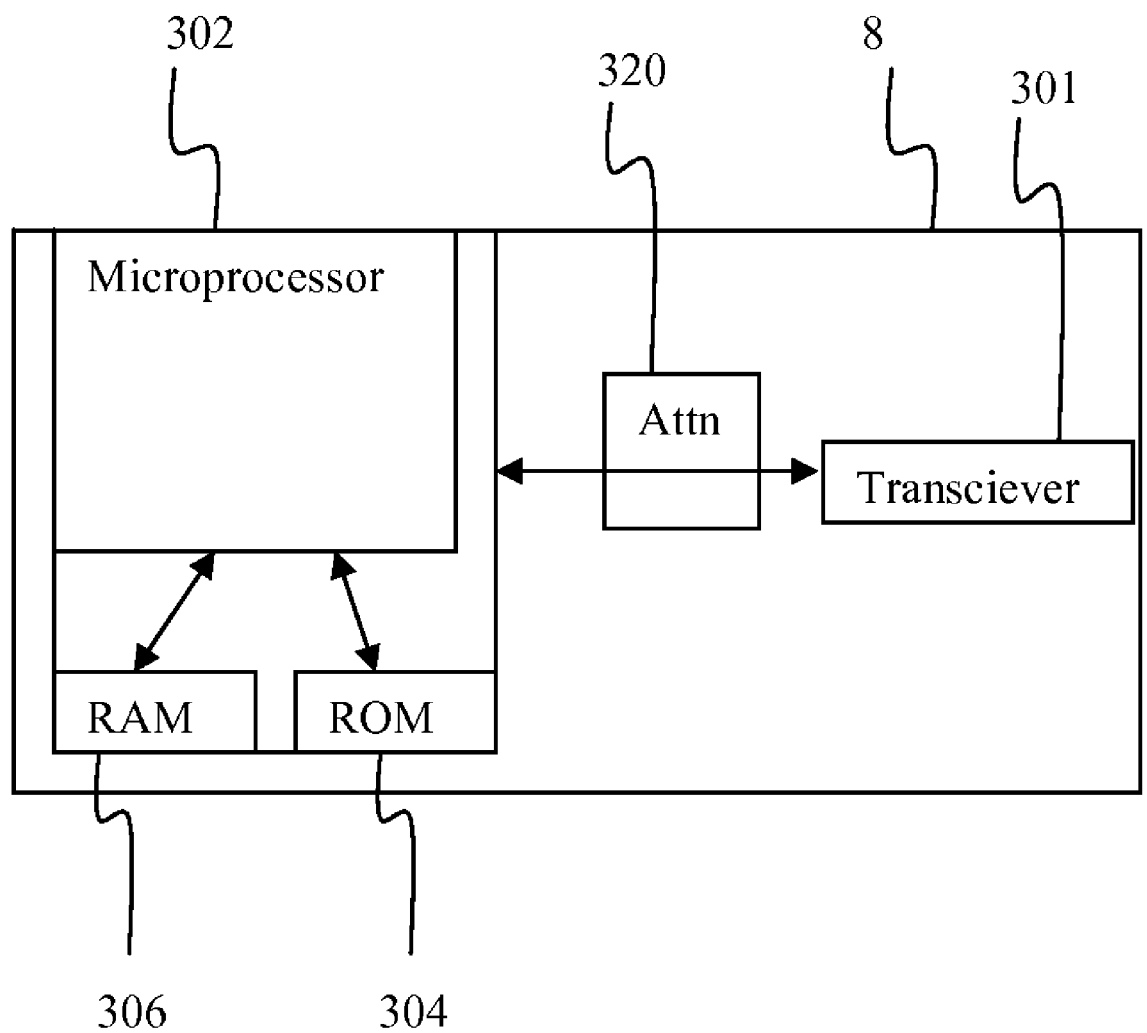
FIG. 4 illustrates an exemplary network element.

FIG. 4 illustrates an exemplary network element 8, such as a cable modem. Network element 8 preferably contains a processor 302 which may communicate with a RAM 306 and ROM 304, and which controls the general operation of the network element, including the pre-equalization parameters and preamble lengths of communications sent by the network element in accordance with instructions from the CMTS 10. Network element 8 also contains a transceiver (which includes a transmitter and receiver) which provides bidirectional RF communication with CMTS 10. Network element 8 may also contain an equalizer unit which may equalize the communications to CMTS 10. Network element 8 may also contain an attenuator 320 which may be controlled by microprocessor to attenuate signals to be transmitted to be within a desired power level. Those of skill in the art will appreciate that the components of network element 8 have been illustrated separately only for discussion purposes and that various components may be combined in practice.

Figure 5:
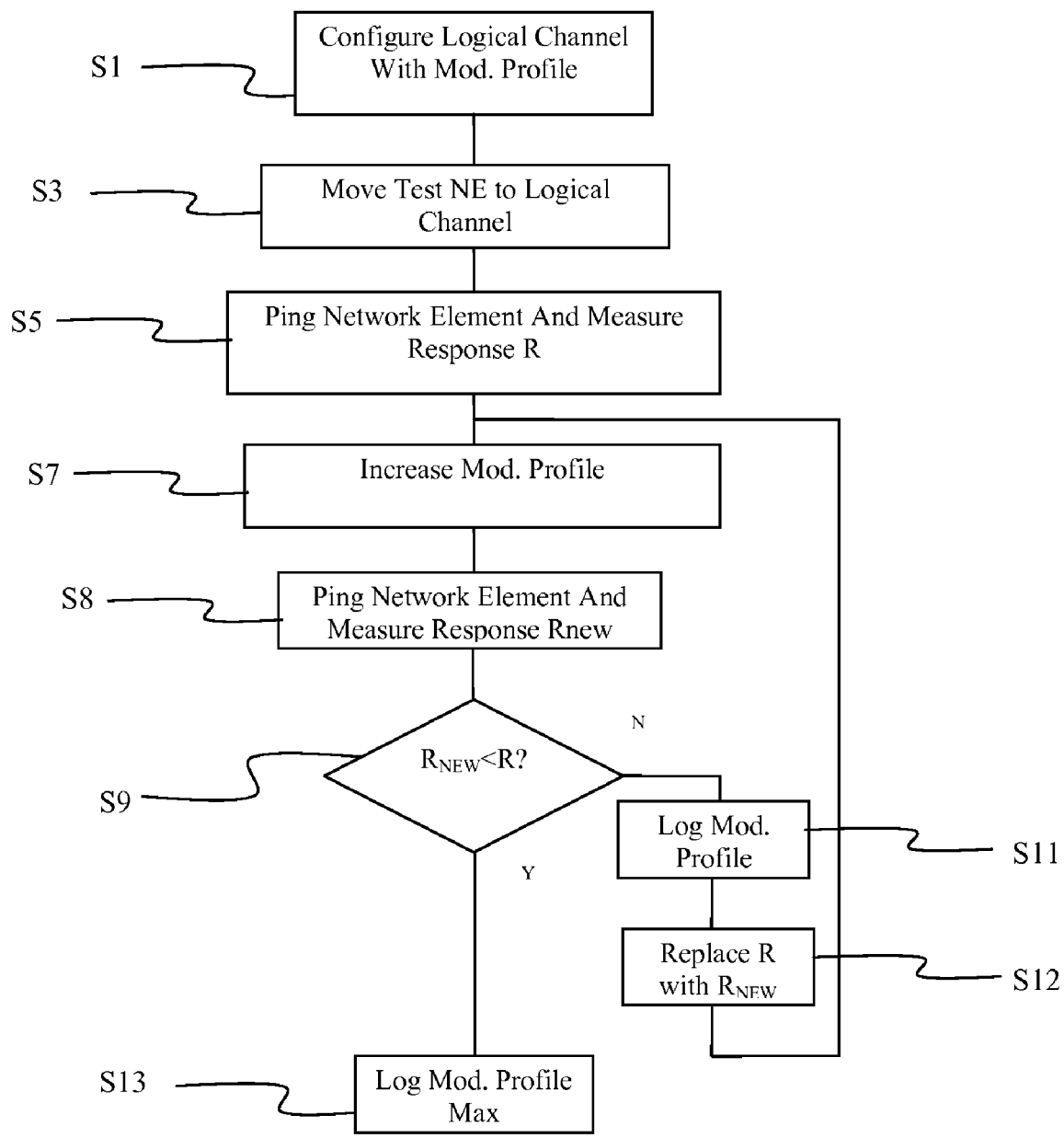
FIG. 5 illustrates an exemplary process in accordance with the principles of the present invention.

An exemplary process for automatically determining the modulation levels that are supported by network elements on a network is illustrated in FIG. 5. The evaluation of the service group may be used by an operator to control modulation agility (to control the modulation parameters of the network communications, e.g. (QPSK, 8QAM, 16QAM, 32QAM, 64QAM, 128QAM or 256QAM). The evaluation of the service group may also be used to control frequency agility to determine a suitable frequency for a communication channel, e.g. a frequency with less noise or higher MER.

As illustrated in step S1 of FIG. 5, a process of determining the testing network element pool is initiated. As illustrated in step S1, an "unused" logical channel is configured with a modulation profile matching that used on an active logical channel(s) associated with a network element to be tested. The network element to be tested may include active network elements. As illustrated in step S2, the test network element is reassigned (or moved) to the logical channel configured in step S1. The reassignment may be performed using either a UCC or DCC depending upon the network element capabilities. Since the modulation profile is the same as the active channel, there should not be any problems moving the device.

As illustrated in step S5, a message requiring a response, e.g. a SM message, is sent to the network element, aka a ping, and the response is measured. The measurement of the response may be performed by an MER measurement. In an alternative implementation, a simple representation of the relative MER values may be used instead of the actual MER values. Other measurements may be used as well or instead of the MER, such as include Signal to Noise Ratio (SNR), Bit Error Rate (BER), Packet Error Rate (PER), Forward Error Correction (FEC) Error Rates, Network Element Transmit Level, Signal Distortion Ratio (referred to as Micro-reflection level within DOCSIS), as well as other statistics.

The modulation profile of the channel is increased in step S7, such as by a step increase, e.g., from QPSK to 8QAM, from 8QAM to 16QAM, from 16QAM to 32QAM, from 32QAM to 64QAM, from 64QAM to 128QAM, or from 128QAM to 256QAM. Another message requiring a response is sent to the network element, step S8. The response received in step S8 is termed RNEW. As illustrated in step S9, No, if RNEW is not significantly less than R, e.g. the new MER is substantially equal to the previous MER measurement prior to increasing the modulation profile, then the modulation profile is logged as being an acceptable modulation profile, step S11. The process returns to step S7 and increases the modulation profile again. The network element is pinged again and its response is measured as RNEW again. This process is repeated, and the increased modulation profiles are logged until the RNEW significantly diverges from R, e.g. the new MER is significantly less the original MER. If RNEW, e.g., the MER reported in step S7 is significantly lower than that recorded in step S5, then a non-linearity is being experienced and we have reached the point of the maximum modulation level supported by the active channel, step S9, Yes. At this point, the maximum modulation profile is determined as the previous modulation profile and is logged, step S13.

Both logical channels may be on the active channel. The measurements in steps S5 and S8 may be made on an alternate frequency from an active channel, such as using the spare receiver, or may be made on an active channel. In a preferred implementation, the MER measurement may be performed by sending an IGMP message to the network element (such as a "ping") or using a DOCSIS station maintenance message from the headend to the selected network element. An exemplary technique for measuring MER using an IGMP message is described in commonly assigned U.S. Pat. No. 6,816,463 to Mike Cooper and Dan Ryan, granted on Nov. 9, 2004, herein incorporated by reference in its entirety.

Another feature is to trigger the network element FFT simultaneously when communicating higher order modulations so as to have a clear picture of upstream aggregate power during actual data transmission at higher modulations.

The "ping" may preferably be sent several times, e.g. 4 times, and use the resulting MER measured from the response received from the network element. Once a desired number of "ping" tests have been performed, the test results may be provided to the operator as the measured value, and the operator may control the network based on the results. When multiple "ping" messages are sent the MER may be calculated from the responses from the multiple "ping" messages from the selected network element, such as by being averaged. Further, when multiple "ping" messages are used, the accumulator and count values prior to the multiple "ping" test may be used with the measured MER from the multiple "ping" tests. In addition, rather than having the operator control the network based upon these results, the CMTS may automatically adjust the network configuration based upon the results.

In addition, industry-accepted approaches which utilize composite measurements which represent the random average of all the network elements transmitting during a given time interval are subject to the variations of which network elements are actively sending data during a given measurement interval. This may produce wide fluctuations in the resulting metric and make its use suspect at best and catastrophic in some cases. The "ping"ing of a single network element eliminates the variability and produces a single metric which may be extrapolated to predict the performance of other network elements. Further, the use of multiple pings may also reduce the affect of transient signals in the upstream communication by "averaging away" the transient activity, e.g. one transient in four pings means it will only contribute to 25% of the MER.

The CMTS spare receiver is preferably used to obtain the MER measurements to avoid impacting service provided to customers. When the spare receiver is used, the return communication channels may be active, hence avoiding a disruption in active service at the time the operator desires to perform the tests. Alternatively, another receiver could be used to make the measurements by being taken "off line" or by adjusting for the impact caused by normal service.

The processes in FIG. 5 may be implemented in hard wired devices, firmware or software running in a processor. A processing unit for a software or firmware implementation is preferably contained in the CMTS. Any of the processes illustrated in FIG. 5 may be contained on a computer readable medium which may be read by microprocessor 102. A computer readable medium may be any medium capable of carrying instructions to be performed by a microprocessor, including a CD disc, DVD disc, magnetic or optical disc, tape, silicon based removable or non-removable memory, packetized or non-packetized wireline or wireless transmission signals.

The invention enables a network operator to optimize their network by readily and automatically determining which modulation profiles network elements may use for communications. Ideally, the network operator would generally like to use higher level modulation profiles to improve communication efficiencies. The present invention will enable the network operator to avoid using the lowest expected profile and allow use of the highest known profile in which communications are acceptable. All measurements may be made through the use of the existing terminal devices (specifically, DOCSIS terminal devices such as MTAs and cable modems) as well as headend equipment (specifically a DOCSIS CMTS).

What is claimed is:

1. An apparatus for monitoring a network comprising:
  a microprocessor configured to:
    configure a logical channel connectable to a test network element with a modulation profile that matches that of an active channel connected to the network, the logical channel separate from the active channel for coupling the test network element to a primary receiver,
    reconfigure the logical channel with a non-matching modulation profile, wherein the non-matching modulation profile varies from the modulation profile used on the active channel connected to the network,
    send a test signal to the test network element coupled to the logical channel configured with the non-matching modulation profile, and
    determine whether the non-matching modulation profile is acceptable for communicating with the test network element using one or more characteristics of a response from the test signal; and
  a receiver configured to receive the response to the test signal from the test network element via the logical channel.

2. The apparatus of claim 1, wherein the acceptable modulation profiles are determined based on one or more of: signal to noise ratio, modulation error ratio, packet error rate, burst error rate, forward error correction error rates, network element transmit level, or signal distortion ratio.

3. The apparatus of claim 1, wherein the receiver is an undedicated receiver in a network.

4. The apparatus of claim 1, wherein the determination of acceptable modulation profiles does not impact existing network communications.

5. A method of for testing a network, the method comprising:
- configuring a logical channel connectable to a test network element with a modulation profile that matches that of an active channel connected to the network for a selected network element, the active channel separate from the logical channel for coupling the selected network element to a primary receiver;
- assigning the selected network element to the logical communication channel;
- reconfiguring the logical channel with a non-matching modulation profile, wherein the non-matching modulation profile varies from the modulation profile used on the active channel connected to the network,
- sending a communication to the selected network element via the logical communication channel configured with the non-matching modulation profile;
- measuring one or more characteristics of a response received from the selected network element, the one or more characteristics describing transmission using the configured modulation profile; and
- determining acceptable modulation profiles for communicating with the selected network element based on the one or more characteristics of the response.

6. The method of claim 5, wherein the one or more characteristics include one or more of: signal to noise ratio, modulation error ratio, packet error rate, burst error rate, forward error correction error rates, network element transmit level, or signal distortion ratio.

7. The method of claim 5, wherein determining acceptable modulation profiles for communicating with the network element based on the one or more characteristics of the response comprises:
- increasing the modulation profile of the logical communication channel to an increased modulation profile until determining the increased modulation profile is unacceptable.

8. The method of claim 7, wherein the modulation profile of the logical communication channel includes at least one of QPSK, 8QAM, 16QAM, 32QAM, 64QAM, 128QAM, or 256QAM.

9. The method of claim 7, wherein determining the increased modulation profile is unacceptable comprises:
- detecting an impairment in the response received from the network element in one or more of the characteristics when the logical connection is configured to the increased modulation profile.

10. The method of claim 5, wherein the logical communication channel couples the selected network element to a spare receiver, the spare receiver separate from the primary receiver.

11. A non-transitory computer readable medium carrying instructions for a computer to perform a method of testing a network comprising:
- configuring a logical channel connectable to a test network element with a modulation profile that matches that of an active channel connected to the network for a selected network element, the active channel separate from the logical channel for coupling the selected network element to a primary receiver;
- assigning the selected network element to the logical communication channel;
- reconfiguring the logical channel with a non-matching modulation profile, wherein the non-matching modulation profile varies from the modulation profile used on the active channel connected to the network,
- sending a communication to the selected network element via the logical communication channel configured with the non-matching modulation profile;
- measuring one or more characteristics of a response received from the selected network element, the one or more characteristics describing transmission using the configured modulation profile; and
- determining acceptable modulation profiles for communicating with the selected network element based on the one or more characteristics of the response.

12. The computer readable medium of claim 11, wherein the one or more characteristics include one or more of: signal to noise ratio, modulation error ratio, packet error rate, burst error rate, forward error correction error rates, network element transmit level, or signal distortion ratio.

13. The computer readable medium of claim 11, wherein determining acceptable modulation profiles for communicating with the network element based on the one or more characteristics of the response comprises:
- increasing the modulation profile of the logical communication channel to an increased modulation profile until determining the increased modulation profile is unacceptable.

14. The computer readable medium of claim 13, wherein the modulation profile of the logical communication channel includes at least one of QPSK, 8QAM, 16QAM, 32QAM, 64QAM, 128QAM, or 256QAM.

15. The computer readable medium of claim 13, wherein determining the increased modulation profile is unacceptable comprises:
- detecting an impairment in the response received from the network element in one or more of the characteristics when the logical connection is configured to the increased modulation profile.

16. The computer readable medium of claim 11 wherein the logical communication channel couples the selected network element to a spare receiver, the spare receiver separate from the primary receiver.

* * * * *